(12) United States Patent
Kawamura et al.

(10) Patent No.: US 10,127,965 B2
(45) Date of Patent: Nov. 13, 2018

(54) APPARATUSES AND METHODS INCLUDING FERROELECTRIC MEMORY AND FOR ACCESSING FERROELECTRIC MEMORY

(71) Applicant: MICRON TECHNOLOGY, INC., Boise, ID (US)

(72) Inventors: Christopher J. Kawamura, Boise, ID (US); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/679,032

(22) Filed: Aug. 16, 2017

(65) Prior Publication Data

US 2018/0061471 A1    Mar. 1, 2018

Related U.S. Application Data

(60) Provisional application No. 62/381,900, filed on Aug. 31, 2016.

(51) Int. Cl.
   *G11C 11/22*      (2006.01)
   *G11C 11/4091*    (2006.01)
   (Continued)

(52) U.S. Cl.
   CPC ...... *G11C 11/2275* (2013.01); *G11C 11/2259* (2013.01); *G11C 11/2273* (2013.01);
   (Continued)

(58) Field of Classification Search
   CPC ............ G11C 11/2275; G11C 11/2273; G11C 11/4091; G11C 11/2297; G11C 11/5657; H01L 27/11504; H01L 27/11509
   (Continued)

(56) References Cited

U.S. PATENT DOCUMENTS 4,103,342 A    7/1978    Miersch et al.
5,218,566 A    6/1993    Papaliolios
              (Continued)

FOREIGN PATENT DOCUMENTS

WO    2018044485       3/2018
WO    2018044486 A1    3/2018
              (Continued)

OTHER PUBLICATIONS

International Search Report and Written Opinion dated Nov. 23, 2017 for PCT Application No. PCT/US2017/045182, pp. all.
              (Continued)

*Primary Examiner* — Huan Hoang
(74) *Attorney, Agent, or Firm* — Dorsey & Whitney LLP

(57) ABSTRACT

Apparatuses and methods are disclosed that include ferroelectric memory and for accessing ferroelectric memory. An example method includes increasing a voltage of a first cell plate of a capacitor to change the voltage of a second cell plate of the capacitor, a second digit line, and a second sense node. The voltage of the second cell plate and the second digit line is decreased to change the voltage of the first cell plate, a first digit line, and a first sense node. The first node is driven to a first voltage and the second node is driven to a second voltage responsive to the voltage of the first node being greater than the second node. The first node is driven to the second voltage and the second node is driven to the first voltage responsive to the voltage of the first node being less than the second node.

26 Claims, 10 Drawing Sheets

(51) Int. Cl.
*H01L 27/11504* (2017.01)
*H01L 27/11509* (2017.01)
*H01L 27/11507* (2017.01)
*G11C 11/56* (2006.01)

(52) U.S. Cl.
CPC ...... *G11C 11/2293* (2013.01); *G11C 11/4091* (2013.01); *H01L 27/11504* (2013.01); *H01L 27/11507* (2013.01); *H01L 27/11509* (2013.01); *G11C 11/2297* (2013.01); *G11C 11/5657* (2013.01)

(58) Field of Classification Search
USPC .................................................. 365/145, 207
See application file for complete search history.

(56) References Cited

U.S. PATENT DOCUMENTS

| | | | |
|---|---|---|---|
| 5,241,503 | A | 8/1993 | Cheng |
| 5,373,463 | A | 12/1994 | Jones, Jr. et al. |
| 5,381,364 | A | 1/1995 | Chern et al. |
| 5,539,279 | A | 7/1996 | Takeuchi et al. |
| 5,598,366 | A | 1/1997 | Kraus et al. |
| 5,617,349 | A | 4/1997 | Koike |
| 5,675,530 | A | 10/1997 | Hirano et al. |
| 5,798,964 | A | 8/1998 | Shimizu et al. |
| 5,889,696 | A | 3/1999 | Kawakubo et al. |
| 5,912,846 | A | 6/1999 | Taylor |
| 5,917,746 | A | 6/1999 | Seyyedy |
| 5,959,922 | A | 9/1999 | Jung |
| 6,034,884 | A | 3/2000 | Jung |
| 6,038,160 | A | 3/2000 | Nakane et al. |
| 6,147,895 | A | 11/2000 | Kamp |
| 6,154,387 | A | 11/2000 | Takata |
| 6,198,654 | B1 * | 3/2001 | Ashikaga ................ G11C 11/22 365/145 |
| 6,229,730 | B1 | 5/2001 | Kato |
| 6,363,002 | B1 | 3/2002 | Nishimura et al. |
| 6,483,737 | B2 | 11/2002 | Takeuchi et al. |
| 6,538,914 | B1 | 3/2003 | Chung |
| 6,687,151 | B2 | 2/2004 | Endo et al. |
| 6,807,082 | B2 | 10/2004 | Aoki et al. |
| 6,961,271 | B2 | 11/2005 | Jeon et al. |
| 2002/0044477 | A1 | 4/2002 | Takeuchi et al. |
| 2003/0173604 | A1 | 9/2003 | Aoki et al. |
| 2004/0119105 | A1 | 6/2004 | Wilson |
| 2005/0012125 | A1 | 1/2005 | Summerfelt et al. |
| 2005/0012130 | A1 | 1/2005 | Forbes |
| 2005/0122763 | A1 | 6/2005 | Yamamura |
| 2005/0146918 | A1 | 7/2005 | Ogiwara et al. |
| 2006/0215472 | A1 | 9/2006 | Yoon et al. |
| 2006/0221746 | A1 | 10/2006 | Kang et al. |
| 2006/0285378 | A1 | 12/2006 | Yamaoka et al. |
| 2008/0265300 | A1 | 10/2008 | Akiyama et al. |
| 2009/0010037 | A1 | 1/2009 | Kang et al. |
| 2010/0165704 | A1 | 7/2010 | Wu et al. |
| 2011/0199811 | A1 | 8/2011 | Kanno et al. |
| 2012/0074466 | A1 | 3/2012 | Setiadi et al. |
| 2012/0170348 | A1 | 7/2012 | Clinton et al. |
| 2012/0307545 | A1 | 12/2012 | McAdams et al. |
| 2013/0094274 | A1 | 4/2013 | Kaneko |
| 2014/0036567 | A1 | 2/2014 | Fukuzumi et al. |
| 2018/0061468 | A1 | 3/2018 | Derner et al. |
| 2018/0061469 | A1 | 3/2018 | Derner et al. |
| 2018/0061477 | A1 | 3/2018 | Kawamura et al. |

FOREIGN PATENT DOCUMENTS

| | | |
|---|---|---|
| WO | 2018044487 | 3/2018 |
| WO | 2018044510 | 3/2018 |

OTHER PUBLICATIONS

U.S. Appl. No. 15/678,978, entitled "Ferroelectric Memory Cells", filed Aug. 16, 2017.
U.S. Appl. No. 15/679,016, entitled "Apparatuses and Methods Including Ferroelectric Memory and for Operating Ferroelectric Memory", filed Aug. 16, 2017.
U.S. Appl. No. 15/679,042, entitled "Apparatuses and Methods Including Two Transistor-One Capacitor Memory and for Accessing Same", filed Aug. 16, 2017.
U.S. Appl. No. 16/005,493, titled "Apparatuses and Methods for Memory Including Ferroelectric Memory Cells and Dielectric Memory Cells", filed Jun. 11, 2018, pp. all.
Henkels, W.H. et al., "Large-Signal 2T, 1C DRAM CELT Signal and Layout Analysis", IEEE Journal of Solid-State Circuits, vol. 29, No. 7, Jul. 1994, 4 pages.
First Office Action for TW Application No. 106128402, dated Jun. 29, 2018; pp. all.
U.S. Appl. No. 16/058,202 titled "Apparatuses and Methods Including Ferroelectric Memory and for Operating Ferroelectric Memory" filed Aug. 8, 2018, pp. all.
U.S. Appl. No. 16/131,969, titled "Apparatuses and Methods Including Ferroelectric Memory and for Accessing Ferroelectric Memory", filed Sep. 14, 2018, pp. all.
U.S. Appl. No. 16/104,709 titled "Ferroelectric Memory Cells", filed Aug. 17, 2018, pp. all.
U.S. Appl. No. 16/105,631 titled "Apparatuses and Methods Including Two Transistor-One Capacitor Memory and for Accessing Same", filed Aug. 20, 2018. pp. all

* cited by examiner

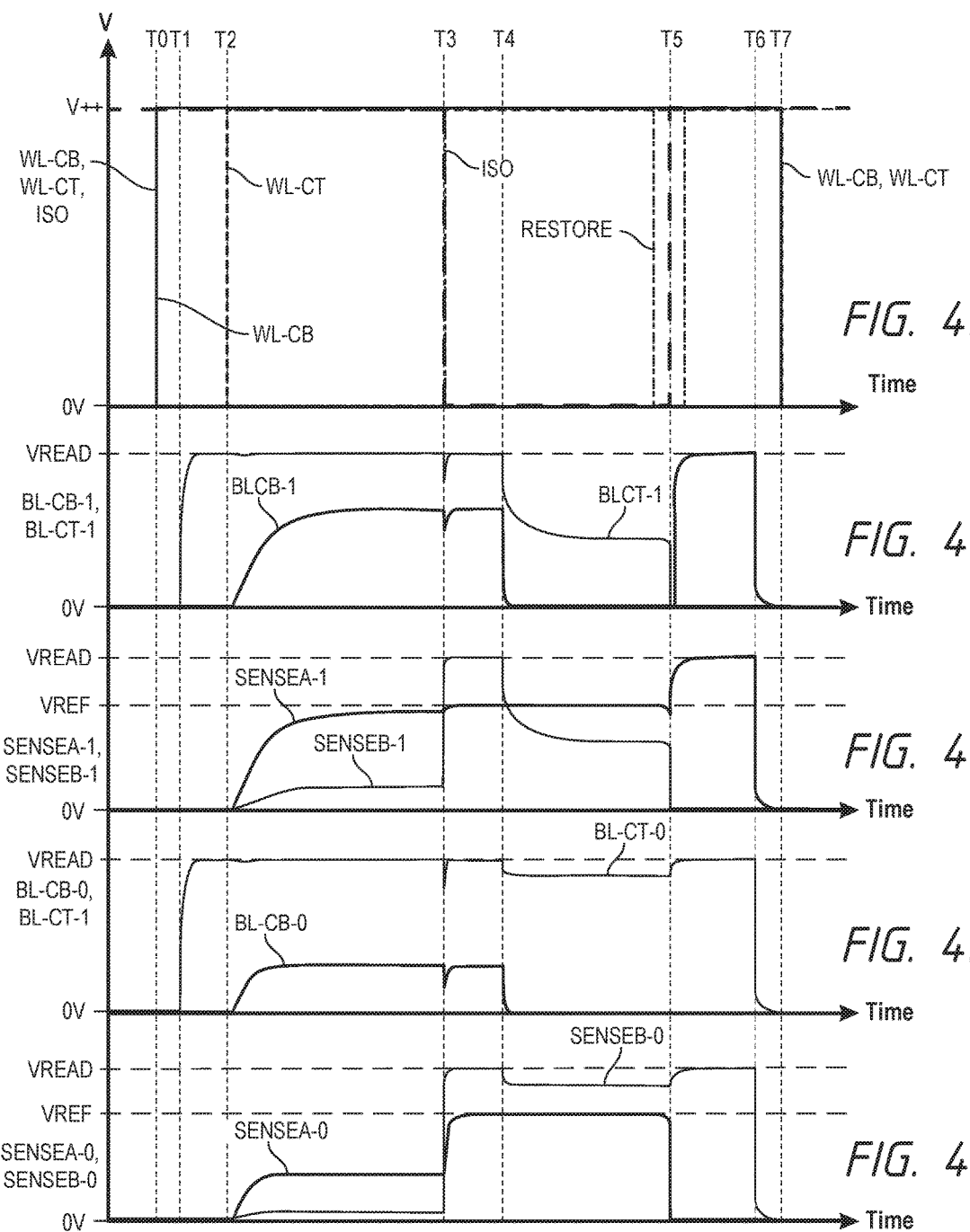

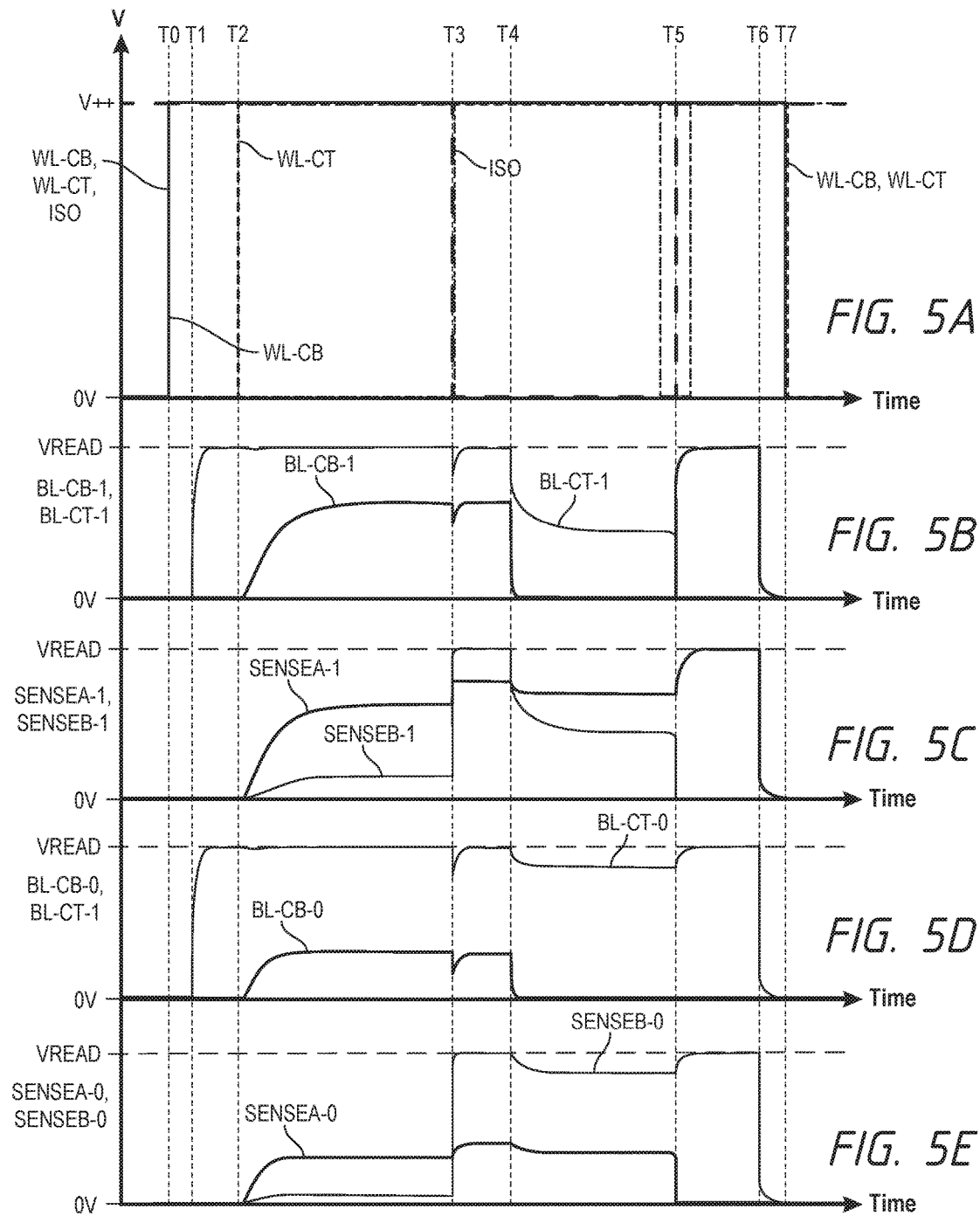

APPARATUSES AND METHODS INCLUDING FERROELECTRIC MEMORY AND FOR ACCESSING FERROELECTRIC MEMORY

CROSS-REFERENCE TO RELATED APPLICATION

This application claims the filing benefit of U.S. Provisional Application No. 62/381,900, filed Aug. 31, 2016. This application is incorporated by reference herein in its entirety and for all purposes.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, restating in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. It is desirable, however, to improve the operation of FeRAM devices. For example, it may be desirable to have improved noise resistance during memory cell sensing, more compact circuits and reduced layout size, and improved timing for operation of FeRAM devices.

BRIEF DESCRIPTION OF THE DRAWINGS

FIGS. 4A-4E are timing diagrams of various signals during a read operation according to an embodiment of the disclosure.

FIGS. 5A-5E are timing diagrams of various signals during a read operation according to an embodiment of the disclosure.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are Provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
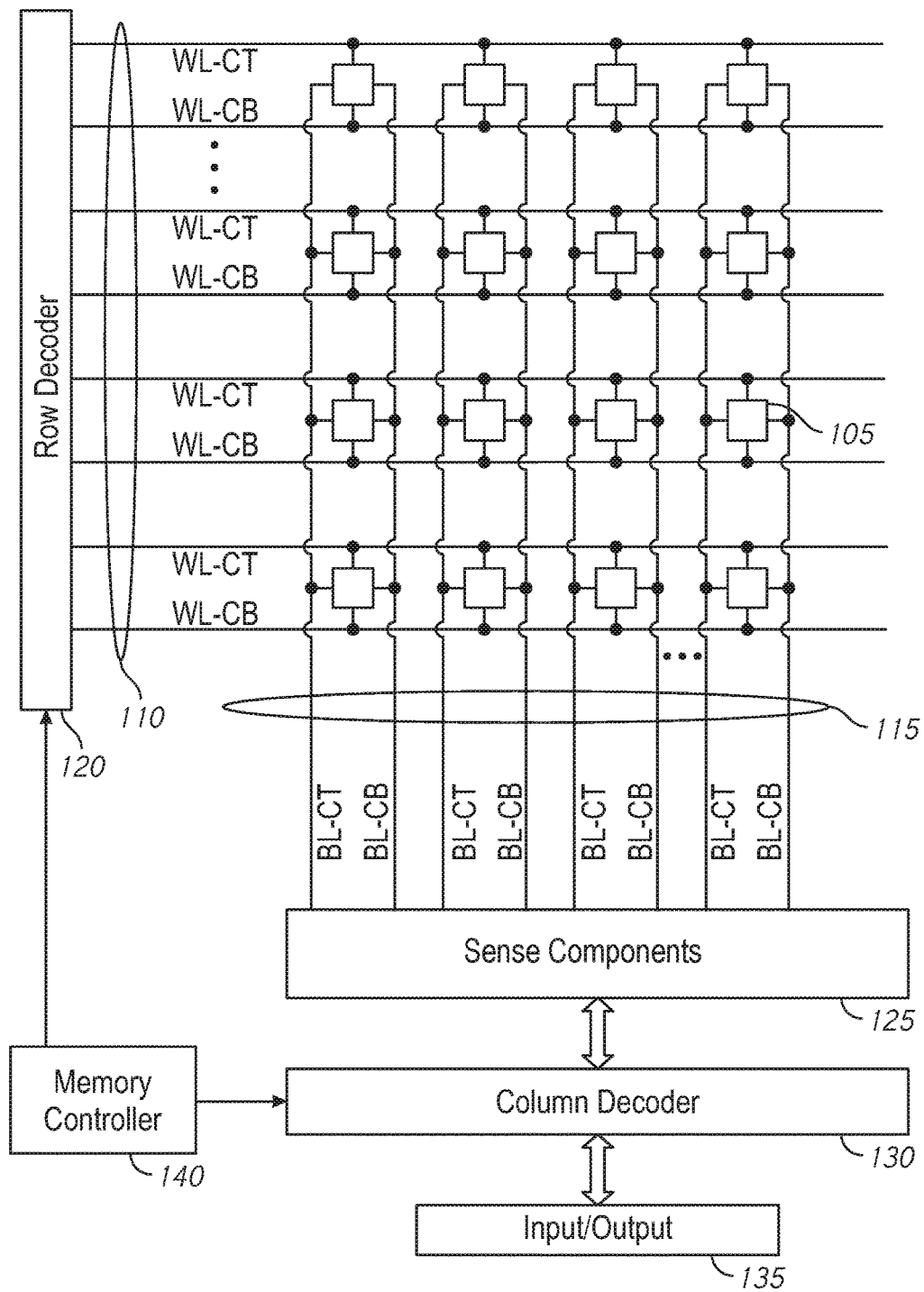
FIG. 1 is a block diagram of an example memory array that supports ferroelectric memory in accordance with various embodiments of the present disclosure.

FIG. 1 illustrates an example memory array 100 that supports ferroelectric memory in accordance with various embodiments of the present disclosure. Memory array 100 may also be referred to as an electronic memory apparatus. Memory array 100 includes memory cells 105 that are programmable to store different states. Each state may represent different logic values. For example, for a memory storing two states, the logic values may be denoted as a logic 0 and a logic 1. In some cases, memory cell 105 is configured to store more than two logic states. A memory cell 105 may include a capacitor to store a charge representative of the programmable states. For example, a charged and uncharged capacitor may represent two logic states, respectively.

A ferroelectric memory cell may include a capacitor that has a ferroelectric as the dielectric material. Different levels of charge of a ferroelectric capacitor may represent different logic states. Ferroelectric memory cells 105 may have beneficial properties that may result in improved performance relative to other memory architectures, for example, persistent storage of logic states without the need for periodic refresh operations.

Operations such as reading and writing may be performed on memory cells 105 by activating or selecting the appropriate access lines 110 and digit lines 115. Access lines 110 may also be referred to as word lines 110. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, doped semiconductors, other conductive materials, or the like. According to the example of FIG. 1, each row of memory cells 105 is coupled to word lines 110 WL-CT and WL-CB, and each column of memory cells 105 is coupled to digit lines 115 BL-CT and BL-CB. By activating the respective word lines 110 and digit lines 115 (e.g., applying a voltage to the word lines 110 or digit lines 115), a memory cell 105 may be accessed at their intersection. Accessing the memory cell 105 may include reading or writing the memory cell 105. The intersection of a word lines 110 and digit lines 115 may be referred to as an address of a memory cell.

In some architectures, the logic storing device of a cell, e.g. a capacitor, may be electrically isolated from the digit lines by selection components. A word line 110 may be coupled to and may control a respective selection component. For example, the selection component may be a transistor and the word line 111 may be coupled to the gate of the transistor. Activating the word line 110 results in an electrical coupling or closed circuit between the capacitor of a memory cell 105 and corresponding digit line 115. The digit lines may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word lines 110 based on the received row address. Similarly, a column decoder 130 receives a column address from the memory controller 140 and activates the appropriate digit lines 115. For example, memory array 100 may include multiple word lines 110, and multiple digit lines 115. Thus, by activating word lines 110 WL-CT and WL-CB and digit lines 115 BL-CT and BL-CB, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto corresponding digit lines 115. Discharging the ferroelectric capacitor may be based on biasing, or applying a voltage, to the ferroelectric capacitor. The discharging may cause a change in the voltage of the digit lines 115, which sense component 125 may compare to a reference voltage (not shown) in order to determine the stored state of the memory cell 105. For example, if a digit line 115 has a higher voltage than the reference voltage, then sense component 125 may determine that the stored state in memory cell 105 is a logic 1 and vice versa. Sense component 125 may include various transistors or amplifiers in order to detect (e.g., compare) and amplify a difference in the signals, which may include latching the amplified-difference. A separate sense component 125 may be provided for each pair of digit lines BL-CT and BL-CB. The detected logic state of memory cell 105 may then be output through column decoder 130 as output 135.

A memory cell 105 may be programmed, or written, by activating the relevant word lines 110 and digit lines 115. As discussed above, activating word lines 110 electrically couples the corresponding row of memory cells 105 to their respective digit lines 115. By controlling the relevant digit lines 115 while the word lines 110 are activated, a memory cell 105 may be written—e.g., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state, and re-write (e.g., restore) operations may be performed to return the original logic state to memory cell 105. For example, the capacitor may be partially or completely discharged during a sense operation, corrupting the stored logic state. So the logic state may be re-written after a sense operation. Additionally, activating word lines 110 may result in the discharge of all memory cells in the row. Thus, several or all memory cells 105 in the row may need to be re-written.

The memory controller 140 may control the operation (e.g., read, write, re-write, etc.) of memory cells 105 through the various components, such as row decoder 120, column decoder 130, and sense components 125. Memory controller 140 may generate row and column address signals in order to activate the desired word lines 110 and digit lines 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously. For example, multiple or all cells of memory array 100 may be accessed simultaneously during a reset operation in which all memory cells 105, or a group of memory cell 105, are set to a single logic state.

Figure 2A:
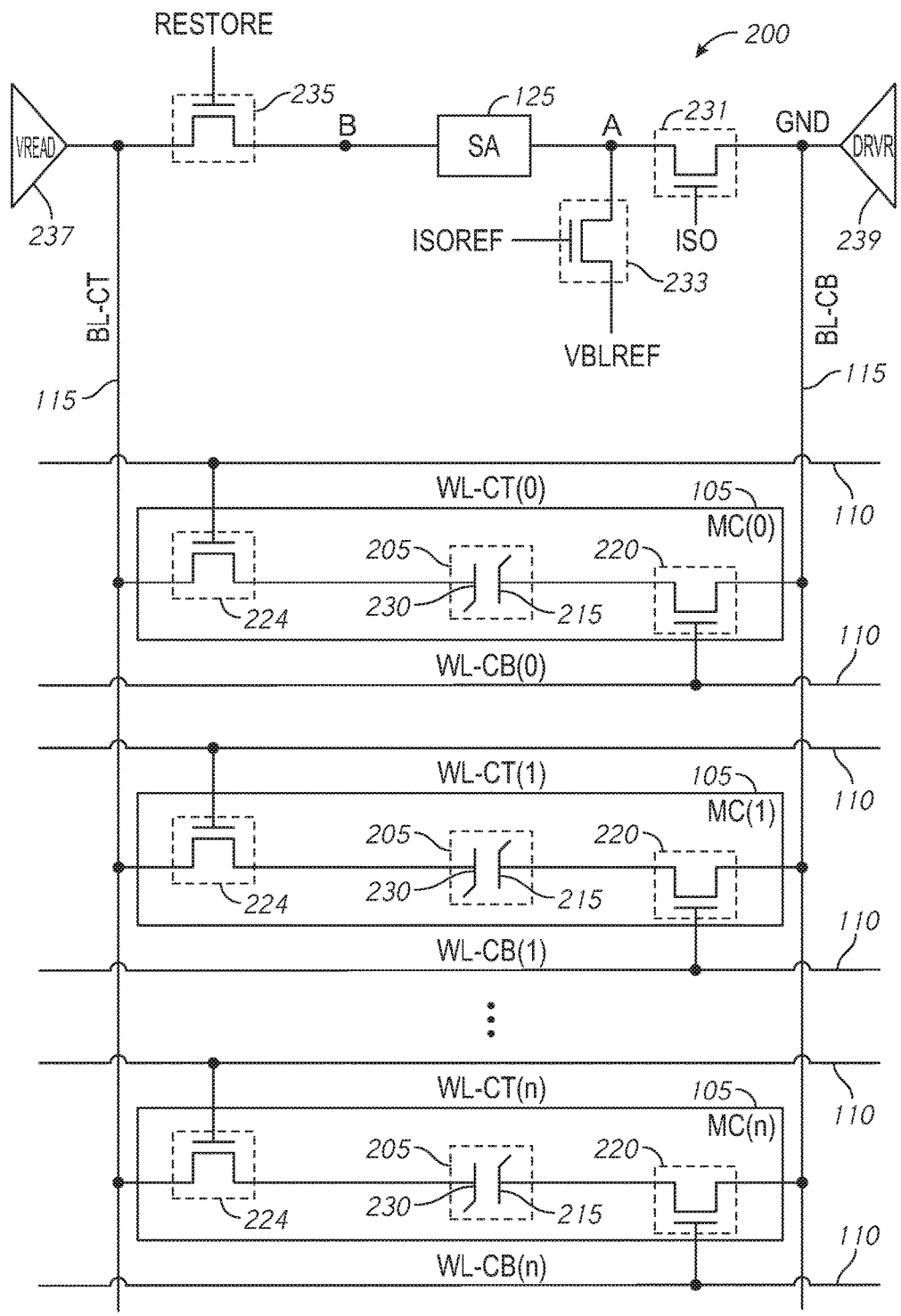
FIG. 2A is a schematic diagram of an example circuit that includes a column of memory cells according to an embodiment of the present disclosure.

FIG. 2A illustrates an example circuit 200 that includes a column of memory cells according to an embodiment of the present disclosure. FIG. 2A illustrates an example circuit 200 that includes memory cells 105 in accordance with various embodiments of the present disclosure. Circuit 200 includes memory cells 105 MC(0)-MC(n), where "n" depends on the array size. The circuit 200 further includes word lines WL-CT(0)-WL-CT(n) and WL-CB(0)-WL-CB (n), digit lines BL-CT and BL-CB, and sense component 125. The word lines, digit lines, and sense component may be examples of memory cells 105, word lines 110, digit lines 115, and sense component 125, respectively, as described with reference to FIG. 1. While one column and n rows of memory cells 105 are shown in FIG. 2A, a memory array may include many columns and rows of memory cells as those shown.

Memory cells 105 may include a logic storage component, such as capacitor 205 that has a first plate, cell top 230, and a second plate, cell bottom 215. Cell tops 230 and cell bottoms 215 may be capacitively coupled through a ferroelectric material positioned between them. The orientation of cell tops 230 and cell bottoms 215 may be flipped without changing the operation of memory cell 105. The memory cells 105 may further include selection components 220 and 224. The selection components 220 and 224 may be transistors, for example, n-type field effect transistors. In such an example, each of the memory cells 105 includes two transistors and one capacitor (e.g., 2T1C).

Circuit 200 also includes isolation switch 231 and reference switch 233. A reference signal VBLREF is provided to the reference switch 233. The isolation switch 231 and the reference switch 233 are coupled to a sense node A of the sense component 125. Activation of the isolation switch 231 is controlled by a signal ISO and activation of the reference switch 233 is controlled by a signal ISOREF. In some embodiments, the reference switch 233 is not included in the circuit 200. For example, in embodiments where the circuit 200 provides on its own reference voltage for determining the logic value stored by a memory cell 105. In such embodiments, providing a separate reference voltage (e.g., the voltage VREF of the VBLREF reference signal) to the sense component 125 is not necessary. Circuit 200 also includes switch 235 and driver circuits 237 and 239. In some examples, isolation switch 231, reference switch 233, and switch 235 may be transistors, for example, n-type field effect transistors, which may be activated by applying a voltage equal to or greater than its threshold voltage. Activation of the switch 235 is controlled by a signal RESTORE. The driver circuit 237 provides a VREAD voltage when activated and the driver circuit 239 provides a ground voltage (GND) when activated.

Memory cells 105 may be in electronic communication with sense component 125 through digit line BL-CT and digit line BL-CB. The switch 235 may be coupled in series between the sense component 125 and the digit line BL-CT and the driver circuit 237. The switch 235 electrically couples or isolates the sense component 125 from the memory cells 105 and the driver circuit 237. In the example of FIG. 2A, cell tops 230 may be accessed via digit line BL-CT and cell bottoms may be accessed via digit line BL-CB. As described above, various states may be stored by charging or discharging capacitor 205.

The stored state of capacitor 205 may be read or sensed by operating various elements represented in circuit 200. Capacitor 205 may be in electronic communication with digit lines BL-CB and BL-CT. For example, capacitor 205 can be isolated from digit lines BL-CB and BL-CT when selection components 220 and 224 are deactivated, and capacitor 205 can be coupled to digit lines BL-CB and BL-CT when selection components 220 and 224 are activated. Activating selection components 220 and 224 may be referred to as selecting memory cell 105. In some cases, selection components 220 and 224 are transistors and the operation is controlled by applying voltages to the transistor gates, where the voltage magnitude is greater than the threshold voltage of the transistors. Word line WL-CB may activate selection component 220 and word line WL-CT may activate selection component 224. For example, a voltage applied to word line WL-CB is applied to the transistor gate of selection component 220 and a voltage applied to word line WL-CT is applied to the transistor gate of selection component 224. As a result, the respective capacitor 205 is coupled to digit lines and BL-CB and BL-CT, respectively. The memory cell 105 may be considered in storage mode when both word lines WL-CB and WL-CT are deactivated. The memory cell 105 may also be considered in storage mode when both word lines WL-CB and WL-CT are activated and the voltages of the digit lines BL-CB and BL-CT are the same.

Word lines WL-CB(0)-WL-CB(n) and WL-CT(0)-WL-CT(n) are in electronic communication with selection components 220 and 224 of memory cells 105 MC(0)-MC(n), respectively. Thus, activating word lines WL-CB and WL-CT of a respective memory cell 105 may activate the memory cell 105. For example, activating WL-CB(0) and WL-CT(0) activates memory cell MC(0), activating WL-CB(1) and WL-CT(1) activates memory MC(1), and so on. In some examples, the positions of selection components 220 and 224 may be switched, such that selection component 220 is coupled between digit line BL-CT and cell top 230, and the selection component 224 is coupled between digit line BL-CB and cell bottom 215.

Due to the ferroelectric material between the plates of capacitor 205, and as discussed in more detail below, capacitor 205 may not discharge upon coupling to digit lines BL-CB and BL-CT. To sense the logic state stored by ferroelectric capacitor 205, word lines WL-CB and WL-CT may be biased to select a respective memory cell 105, and a voltage may be applied to the digit line BL-CT, for example, by driver circuit 237. The digit line BL-CT bias may be applied before or after activating selection component 224. Biasing the digit line BL-CT may result in a voltage difference across capacitor 205, which may yield a change in the stored charge on capacitor 205. Likewise, biasing the digit line BL-CB may also result in a voltage difference across capacitor 205, which may yield a change in the stored charge on capacitor 205. The magnitude of the change in stored charge may depend on the initial state of each capacitor 205—e.g., whether the initial state stored a logic 1 or a logic 0. When the selection component 220 is activated by the word line WL-CB, the change in stored charge due to biasing the digit line BL-CT may cause a change in the voltage of digit line BL-CB based on the charge stored on capacitor 205. Similarly, when the selection component 224 is activated by the word line WL-CT, the change in stored charge due to biasing the digit line BL-CB may cause a change in the voltage of digit line BL-CT based on the charge stored on capacitor 205. The change in the voltage of digit lines BL-CB or BL-CT may cause a change on sense nodes A and B when the isolation switch 231 and switch 235 are activated, all respectively. The resulting voltage of digit line BL-CB or digit line BL-CT may be compared to a reference voltage by the sense component 125 in order to determine the logic value represented by the stored state of each memory cell 105. In some embodiments, the resulting voltage of digit line BL-CB or digit line BL-CT may be compared by the sense component 125 to a reference voltage that is a constant voltage, for example, a VREF voltage of the VBLREF signal. In other embodiments, the resulting voltage of digit line BL-CB or digit line BL-CT may be compared by the sense component 125 to a reference voltage that is self-provided, for example, a reference voltage that results from biasing of the digit lines BL-CB and BL-CT during an access operation.

Sense component 125 may include various transistors or amplifiers to detect and amplify a difference in signals, which may including latching the amplified difference. Sense component 125 may include a sense amplifier that receives and compares the voltage of either of its sense nodes (e.g., sense nodes A or B) and the voltage of the reference signal VBLREF, which may be a reference voltage. In some embodiments, the voltage of either of the sense nodes may be compared to a self-provided reference voltage. The voltages of the sense nodes A and B may be affected by the voltages of the digit lines BL-CB and BL-CT, respectively, for example, when the sense node A is coupled to the digit line BL-CB and when the sense node B is coupled to the digit line BL-CT. The sense amplifier output (e.g., sense node) may be driven to the higher (e.g., a positive) or lower (e.g., negative or ground) supply voltage based on the comparison and the other sense node may be driven to the complementary voltage (e.g., the positive supply, voltage is complementary to the negative or ground voltage, and the negative or ground voltage is complementary to the positive supply voltage). For instance, if the sense node B has a higher voltage than reference signal VBLREF or a higher voltage than a self-provided reference voltage, then the sense amplifier may drive the sense node B to a positive supply voltage and drive the sense node A to a negative or ground voltage. Sense component 125 may latch the state of the sense amplifier (e.g., voltages of sense node A and/or sense node B and/or the voltages of digit lines BL-CB and/or BL-CT), which may be used to determine the stored state and logic value of memory cell 105, e.g., logic 1. Alternatively, if the sense node B has a lower voltage than reference signal VBLREF or lower voltage than a self-provided reference voltage, the sense amplifier may drive the sense node B to a negative or ground voltage and drive the sense node A to a positive supply voltage. Sense component 125 may also latch the sense amplifier state for determining the stored state and the logic value of memory cell 105, e.g., logic 0. The stored state may represent a logic value of memory cell 105, which may then be output, for example, through column decoder 130 as output 135 with reference to FIG. 1. In embodiments where the sense component 125 also drives the digit lines BL-CB and BL-CT to complementary voltages, the complementary voltages may be applied to the memory cell 105 to restore the original data state read. By restoring the data, a separate restore operation is unnecessary.

As previously described, the word lines WL-CB and WL-CT and the selection components 220 and 224 provide independent control of cell bottom 215 and cell top 230 of the capacitor 205, thus, removing the need for a shared cell plate, as is typical with conventional ferroelectric memories. As a result, the cells may be less susceptible to disturb mechanisms, for example, cell plate related pattern noise. Additionally, cell plate driver circuits, which are needed for shared cell plate designs, are not needed which can reduce circuit size. The digit lines of the plurality of columns of memory cells may be driven to voltages independently of one another. For example, the digit line BL-CT (the digit line coupled through a selection component to the cell top, which is opposite of the cell bottom) of a first column of memory cells may be driven to a voltage independently of the voltage to which the digit line BL-CT of a second column of memory cells are driven.

Figure 2B:
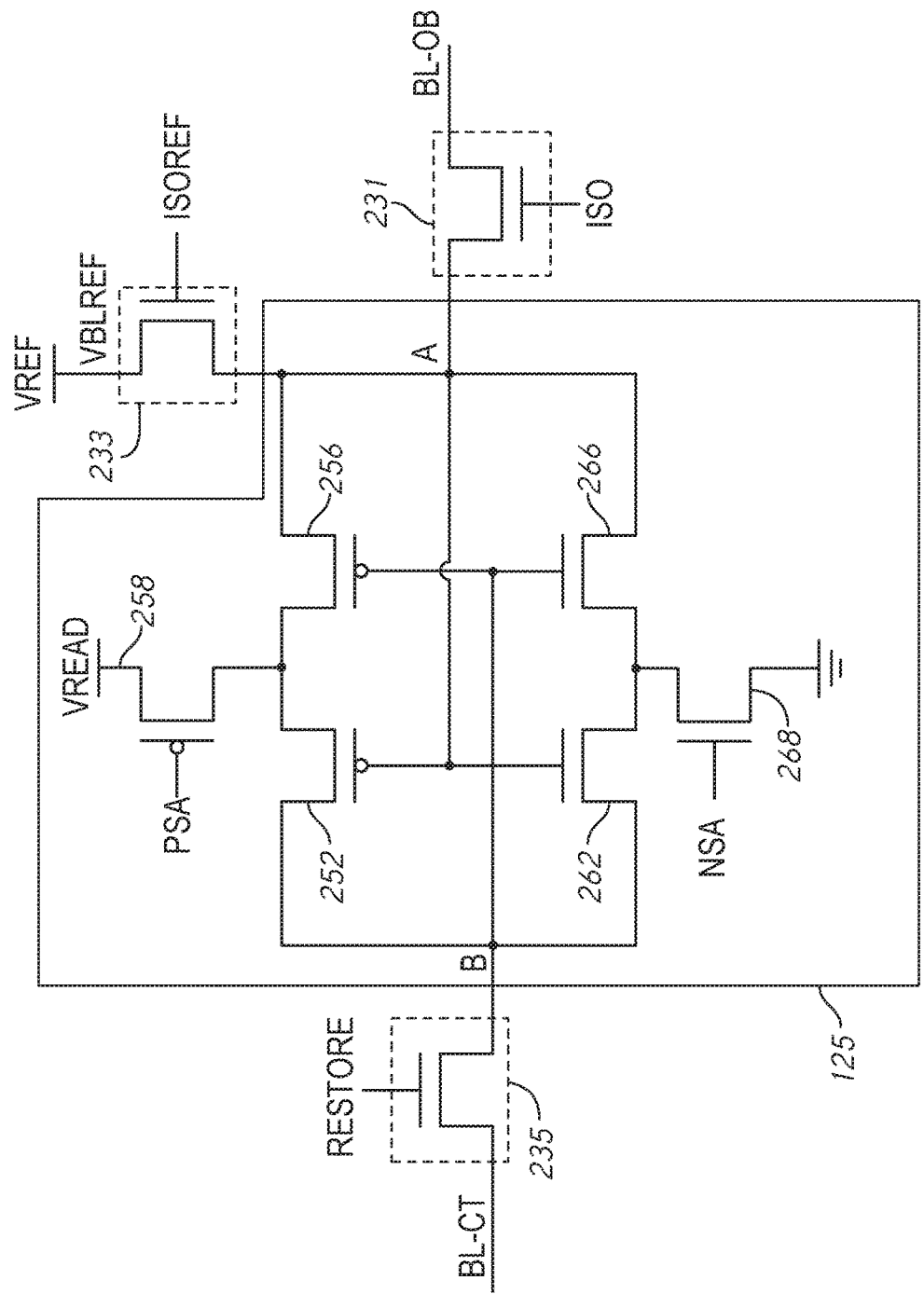
FIG. 2B is a schematic diagram of a sense component according to an embodiment of the disclosure.

FIG. 2B illustrates a sense component 125 according to an embodiment of the disclosure. The sense component 125 includes p-type field effect transistors 252 and 256 and n-type field effect transistors 262 and 266. Gates of the transistor 252 and transistor 262 are coupled to sense node A. Gates of the transistor 256 and transistor 266 are coupled to sense node B. The transistors 252 and 256, and the transistors 262 and 266 represent a sense amplifier. A p-type field effect transistor 258 is configured to be coupled to a power supply (e.g., VREAD voltage power supply) and is coupled to, a common node of the transistors 252 and 256. The transistor 258 is activated by an active PSA signal (e.g., active low logic). An n-type field effect transistor 268 is configured to be coupled to a sense amplifier reference voltage e.g., ground) and is coupled to a common node of the transistors 262 and 266. The transistor 268 is activated by an active NSA signal (e.g., active high logic). Reference switch 233 coupled to sense node A is also shown in FIG. 2B. A reference signal VBLREF is provided to the reference switch 233. Activation of the reference switch 233 is controlled by a signal ISOREF. As previously described, in some embodiments, the reference switch 233 is not included in the circuit 200, such as in embodiments where the circuit 200 provides on its own reference voltage for determining the logic value stored by a memory cell 105. In such embodiments, providing a separate reference voltage (e.g., the voltage VREF of the VBLREF reference signal) to the sense component 125 is not necessary.

In operation, the sense amplifier is activated by activating the PSA and NSA signals to couple the sense amplifier to the voltage of the power supply and the sense amplifier reference voltage. When activated, the sense amplifier compares the voltages of sense nodes A and B, and amplifies a voltage difference by driving the sense nodes A and B to complementary voltage levels (e.g., driving sense node A to VREAD and sense node B to ground, or driving sense node A to ground and sense node B to VREAD). When the sense nodes A and B have been driven to the complementary voltage levels, the voltages of sense nodes A and B are latched by the sense amplifier and remain latched until the sense amplifier is deactivated.

With reference to FIG. 2A, to write memory cell 105, a voltage may be applied across capacitor 205. Various methods may be used. In some examples, selection components 220 and 224 may be activated through word lines WL-CB and WL-CT, respectively, in order to electrically couple capacitor 205 to digit lines BL-CB and BL-CT. For a ferroelectric capacitor 205, a voltage may be applied across capacitor 205 by controlling the voltage of cell top 230 (through digit line BL-CT) and cell bottom 215 (through digit line BL-CB) to apply a positive or negative voltage across the capacitor 205.

In some examples, a restore operation may be performed after sensing. As previously discussed, the sense operation may degrade or destroy the originally stored state of the memory cell 105. After sensing, the state may be written back to the memory cell 105. For example, sense component 125 may determine the stored state of memory cell 105 and may then write the same state back, for example, through isolation switch 231 and switch 235.

Figure 3A:
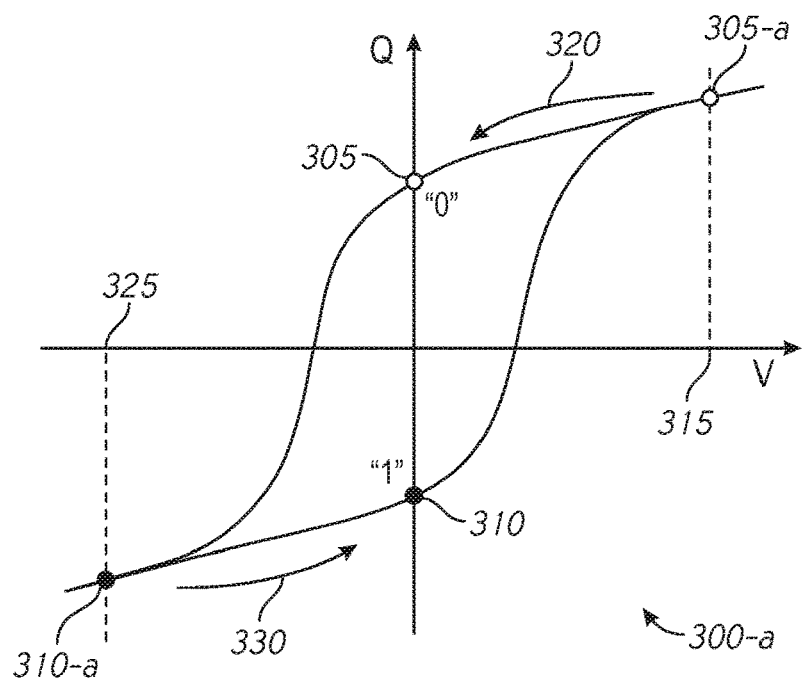
FIG. 3A and FIG. 3B are diagrams of example non-linear electrical properties for a ferroelectric memory cell in accordance with various embodiments of the present disclosure.
Figure 3B:
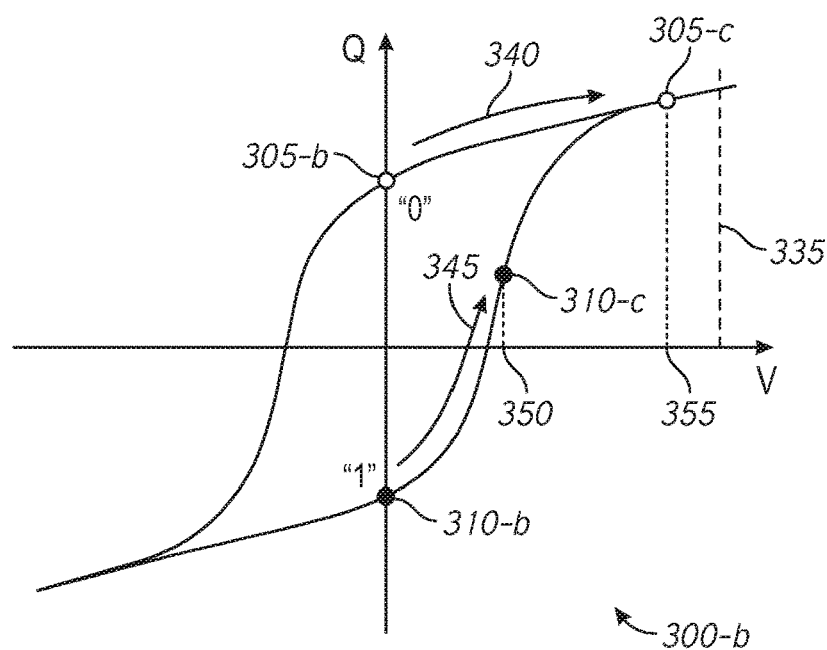

Ferroelectric materials have non-linear polarization properties. FIG. 3A and FIG. 3B illustrate examples of non-linear electrical properties with hysteresis curves 300-a (FIG. 3A) and 300-b (FIG. 3B) for a memory cell for ferroelectric memory in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2A) as a function of a voltage difference, V.

A ferroelectric material is characterized by a spontaneous electric polarization, for example, it maintains a non-zero electric polarization in the absence of an electric field. Example ferroelectric materials include barium titanate (BaTiO$_3$), lead titanate (PbTiO$_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell top 230 and maintaining the second terminal (e.g., a cell bottom 215) at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 110 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305 and 310 may also be referred to as the remnant polarization (Pr) values, which is the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state, and as a result, the final stored charge (Q) depends on whether charge state 305-*b* and 310-*b* was initially stored. For example, hysteresis curve 300-*b* illustrates two possible stored charge states 305-*b* and 310-*b*. Voltage 335 may be applied across the capacitor as previously discussed. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line coupled to the memory cell. For example, if the capacitor is electrically coupled to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis. Charge states 305-*c* and 310-*c* may be defined with respect to the digit line capacitance. As a result, the voltage of the capacitor, voltage 350 or, voltage 355, may be different and may depend on the initial state of the capacitor.

By comparing the digit line voltage to a reference voltage, the initial state of the capacitor may be determined. The digit line voltage may be the difference between voltages 335 and the final voltage across the capacitor, voltage 350 or voltage 355 (e.g., voltage 335-voltage 350) or (e.g., voltage 335-voltage 355). A reference voltage may be generated such that its magnitude is between the two possible digit line voltages in order to determine the stored logic state, for example, if the digit line voltage is higher or lower than the reference voltage. For example, the reference voltage may be an average of the two quantities (voltage 335-voltage 350) and (voltage 335-voltage 355). In another example, the reference voltage may be provided by isolating a voltage on first sense node of a sense component, then causing a voltage change on a second sense node of the sense component through a digit line, and comparing the resulting voltage of the second sense node with the isolated voltage of the first sense node. Upon comparison by the sense component, the sensed digit line voltage may be determined to be higher or lower than the reference voltage, and the stored logic value of the ferroelectric memory cell (e.g., a logic 0 or 1) may be determined.

FIGS. 4A-4E are timing diagrams of various signals during a read operation according to an embodiment of the disclosure. FIGS. 4A-4E will be described with reference to memory array 100 and example circuit 200 of FIGS. 1 and 2. The example read operation of FIGS. 4A-4E may provide increased voltage margin relative to a reference voltage used to determine the stored state (and the corresponding logic value) of a memory cell.

Prior to time T0 the digit line BL-CB is coupled to the sense node A of the sense component 125 through an activated isolation switch 231. The switch 235 is deactivated so that the voltage of the digit line BL-CT and the voltage of the sense node B are independent of one another. The digit line BL-CB and sense node A, and the digit line BL-CT and sense node B are all precharged to a voltage, such as ground. At time T0, the word line WL-CB is activated to activate the selection component 220 to couple the cell bottom 215 to the digit line BL-CB. At time T1 the driver circuit 237 is enabled to drive a voltage VREAD onto the digit line BL-CT. The word line WL-CT is activated at time T2 to activate the selection component 224 to couple the cell top 230 to the digit line BL-CT (FIG. 4A).

The voltage VREAD is applied to the cell top 230 through the activated selection component 224 to cause a voltage change at the cell bottom 215. As previously discussed, the magnitude of the change in voltage caused at the cell bottom 215 is based at least in part on the charge state initially stored by the capacitor 205. The voltage change at the cell bottom 215 from an initial voltage to an increased voltage also causes the voltage of the digit line BL-CB and the sense node A to change as well. Where the initial charge state represents a logic 1, the sense node A (SENSEA-1 in FIG. 4C) and the digit line BL-CB (BL-CB-1 in FIG. 4B) change from ground (e.g., the initial voltage) to a first voltage (e.g., the increased voltage) (FIG. 4C). Where the initial charge state represents a logic 0, the sense node A (SENSEA-0 in FIG. 4E) and the digit line BL-CB (BL-CB-0 in FIG. 4B) change from ground (e.g., the initial voltage) to a second voltage (e.g., the increased voltage). In the example shown in FIGS. 4A-4E, the first voltage is greater than the second voltage.

The switch 235 is still not active at time T2, and thus, the digit line BL-CT and sense node B are not coupled through an active switch 235. Nonetheless, coupling the voltage VREAD at time T2 to the cell top 230 through the digit line BL-CT and the activated selection component 224 also causes the voltage of sense node B to change. Where the initial charge state represents a logic 1, the sense node B (SENSEB-1 in FIG. 4C) changes from ground to a third voltage. Where the initial charge state represents a logic 0, the sense node B (SENSEB-0 in FIG. 4D) changes from ground to a fourth voltage. In the example shown in FIG. 4, the third voltage is greater than the fourth voltage, and both the third and fourth voltages are less than the second voltage. The voltages of sense node A, sense node B, and the digit line BL-CB develop between time T2 and T3.

At time T3 the isolation switch 231 is deactivated so that the sense node A is isolated from the digit line BL-CB (FIG. 5A) and the switch 235 is activated by the signal RESTORE to conduct voltage between the sense node B and the digit line BL-CT. The reference switch 233 is then activated to provide a voltage VREF of a reference signal VBLREF to the sense node A. The voltage VREF of the reference signal VBLREF is a constant (e.g., fixed) voltage. As a result, the voltage of sense node A changes from the first or second voltage to the voltage VREF by the reference signal VBL-REF (FIGS. 4C and 4E). The sense node B is coupled to the digit line BL-CT through the activated switch 235, which causes the voltage of sense node B to change from the third or fourth voltage to the voltage VREAD, which is the voltage of the digit line BL-CT (FIGS. 4C and 4E).

The driver circuit 239 is enabled at time T4 to drive the digit line BL-CB to ground, which causes the cell bottom 215 to also change to ground. The voltage of the digit line BL-CB may change from the first voltage (due to the initial charge state of the capacitor 205 corresponding to logic 1 to ground (FIG. 4B), or from the second voltage (due to the initial charge state of the capacitor 205 corresponding to logic 0) to ground (FIG. 4D). The change in voltage from the first voltage to ground is greater than the change in voltage from the second voltage to ground.

The change in voltage of the cell bottom 215 due to the digit line BL-CB being driven to ground is coupled across the capacitor 205 to cause a change in voltage of the cell top 230. With the sense node B coupled to the cell top 230 through activated selection component 224, digit line BL-CT, and activated switch 235, the change in voltage causes the voltage of the sense node B to change as well. The change in voltage of sense node B will depend on the change in voltage of the digit line BL-CB. For example, where the change in voltage of the digit line BL-CB is from the first voltage to ground, the voltage of sense node B changes from the VREAD voltage to a fifth voltage (FIG. 4C) that is less than the voltage VREF of the VBLREF signal applied to sense node A. Where the change in voltage of the digit line BL-CB is from the second voltage to ground, the voltage of sense node B changes from the VREAD voltage to a sixth voltage (SENSEB-0) that is greater than the voltage VREF of the VBLREF signal applied to sense node A.

Prior to time T5 the switch 235 is deactivated by the signal RESTORE to isolate the sense node B from the digit line BL-CT. At time T5 the sense component 125 is activated and the isolation switch 231 is activated to couple the sense node A to the digit line BL-CB. Also at time T5, or shortly thereafter, the switch 235 is activated to couple the sense node B to the digit line BL-CT. With the sense component 125 activated, a voltage difference between the sense node A and sense node B is detected and amplified to drive the sense nodes to complementary voltages (e.g., VREAD and ground). The digit lines BL-CB and BL-CT are likewise driven to complementary voltages by the sense component 125 through the activated isolation switch 231 and the activated switch 235. For example, where the voltage of sense node B is less than the voltage VREF of sense node A (e.g., sense node B at the fifth voltage (SENSEB-1 in FIG. 4C)), the activated sense component 125 drives the sense node B (and digit line BL-CT) to ground and the sense node A (and digit line BL-CB) to voltage VREAD. In contrast, where the voltage of sense node B is greater than the VREF voltage of sense node A (e.g., sense node B at the sixth voltage (SENSEB-0 in FIG. 4E)), the activated sense component 125 drives the sense node B (and digit line BL-CT) to voltage VREAD and the sense node A (and digit line BL-CB) to ground FIG. 4E. The voltages of the sense node A and sense node B are latched by the sense component 125 after being driven to complementary voltages. The latched voltages of the sense nodes A and B represent a corresponding logic value, which may be output, for example, through column decoder 130 as output 135 (FIG. 1).

Also at time T5 or after time T5 the isolation switch 231 is activated to couple the sense node A to the digit line BL-CB (FIG. 4A). Sense node B is coupled to the digit line BL-CT through the activated switch 235. As a result, the driving of the sense nodes A and B to complementary voltages by the sense component 125 also drives the digit lines BL-CB and BL-CT to the corresponding complementary voltages. Similarly, the driving of the digit lines BL-CB and BL-CT also drives the cell bottom 215 and cell top 230 to the complementary voltages.

For example, driving the sense node B to ground and the sense node A to the voltage VREAD (FIG. 4C) also drives the digit line BL-CT and cell top 230 to ground and drives the digit line BL-CB and cell bottom 215 to the voltage VREAD (FIG. 4B). Driving the sense node B to voltage VREAD and the sense node A to ground (FIG. 4E) also drives the digit line BL-CT and the cell top 230 to voltage VREAD and drives the digit line BL-CB and the cell bottom 215 to ground (FIG. 4D). Driving the complementary voltages to the cell top 230 and the cell bottom 215 ensures that the read operation does not change, or degrade the original charge state of the capacitor 205 by restoring the original charge state of the capacitor 205.

The sense component 125 is deactivated at time T6 and the voltages of sense nodes A and B, and digit lines BL-CB and BL-CT are driven to ground. The word lines and WL-CT are deactivated at time T7 (FIG. 4A) to deactivate the selection components 220 and 224 to isolate the capacitor 205 from the digit lines and BL-CT, respectively, to complete the read operation.

FIGS. 5A-5E are timing diagrams of various signals during a read operation according to an embodiment of the disclosure. FIGS. 5A-5E will be described with reference to memory array 100 and example circuit 200 of FIGS. 1 and 2. As will be described in more detail below, the read operation of FIGS. 5A-5E relies on self-provided reference voltage for determining the logic value stored by a memory cell. Thus, a separate reference voltage for this purpose is not needed in the example read operation of FIGS. 5A-5E, which may reduce circuit complexity and improve circuit density. For example, self-provided (e.g., locally created) reference voltages may allow for eliminating two transistors from the sense component, and may allow for eliminating reference amps and a reference distribution network. Additionally, self-provided reference voltages may be beneficial because ferroelectric memory cells are subject to cycling, imprinting and sensitivity of temperature variations affecting a sense window relative to a constant reference voltage.

Prior to time T0 the digit line BL-CB is coupled to the sense node A of the sense component 125 through an active isolation switch 231. The digit line BL-CB and sense node A, and the digit line BL-CT and sense node B are all precharged to a reference voltage, such as ground. At time T0, the word line WL-CB is activated to activate the selection component 220 to couple the digit line BL-CB to the cell bottom 215. At time T1 the driver circuit 237 is enabled to drive a voltage VREAD onto the digit line BL-CT. The word line WL-CT is activated at time T2 to activate the selection component 224 to couple the digit line BL-CT to the cell top 230 (FIG. 5A).

The voltage VREAD is applied to the cell top 230 through the activated selection component 224 to cause a voltage change at the cell bottom 215. As previously discussed, the magnitude of the change in voltage caused at the cell bottom 215 is based at least in part on the charge state initially stored by the capacitor 205. The voltage change at the bottom 215 also causes the voltage of the digit line BL-CB and the sense node A to change as well. Where the initial charge state represents a logic 1, the sense node A (SENSES-1 in FIG. 5C) and the digit line BL-CB (BL-CB-1 in FIG. 5B) change from ground to a first voltage. Where the initial charge state represents a logic 0, the sense node A (SENSEA-0 in FIG. 5E) and the digit line BL-CB (BL-CB-0 in FIG. 5D) change from ground to a second voltage. In the example shown in FIGS. 5B-5E, the first voltage is greater than the second voltage.

The switch 235 is still not active at time T2, and thus, the digit line BL-CT and sense node B are not coupled through an active switch 235. Nonetheless, coupling the voltage VREAD at time T2 to the cell top 230 through the digit line BL-CT and the activated selection component 224 also causes the voltage of sense node B to change. Where the initial charge state represents a logic 1, the sense node B (SENSEB-1 in FIG. 5C) changes from ground to a third voltage. Where the initial charge state represents a logic 0, the sense node B (SENSEB-0 in FIG. 5D) changes from ground to a fourth voltage. In the example shown in FIG. 5, the third voltage is greater than the fourth voltage, and both the third and fourth voltages are less than the second voltage. The voltages of sense node A, sense node B, and the digit line BL-CB develop between time T2 and T3.

At time T3 the isolation switch 231 is deactivated so that the sense node A is isolated from the digit line in FIG. 5A and the switch 235 is activated by the signal RESTORE to conduct voltage between the sense node B and the digit line BL-CT. As a result, the voltage of sense node A may change without changing the voltage of digit line BL-CB, and vice versa. With the switch 235 activated to couple the sense node B to the digit line BL-CT, the voltage of sense node B changes from the third or fourth voltage to the voltage VREAD, which is the voltage of the digit line BL-CT (FIGS. 5C and 5E). With the isolation switch 231 deactivated, the digit line BL-CB remains at the first or second voltage and the sense node A increases relative to the first or second voltages (FIGS. 5C and 5E).

The driver circuit 239 is enabled at time T4 to drive the digit line BL-CB to ground, which causes the cell bottom 215 to also change to ground. The voltage of the digit line BL-CB may change from the first voltage (due to the initial charge state of the capacitor 205 corresponding to logic 1) to ground (FIG. 5B), or from the second voltage (due to the initial charge state of the capacitor 205 corresponding to logic 0) to ground (FIG. 5D). The change in voltage from the first voltage to ground is greater than the change in voltage from the second voltage to ground. The change in voltage of the digit line BL-CB also causes the voltage of the sense node A to change. Where the sense node A is at a voltage increased relative to the first voltage, the voltage of sense node A (SENSEA-1 in FIG. 5C) changes to a fifth voltage due to the digit line BL-CB being driven to ground. Where the sense node A is at a voltage increased relative to the second voltage, the voltage of sense node A (SENSEA-0 in FIG. 5E) changes to a sixth voltage due to the digit line BL-CB being driven to ground.

The change in voltage of the cell bottom 215 due to the digit line BL-CB being driven to ground is coupled across the capacitor 205 to cause a change in voltage of the cell top 230. With the sense node B coupled to the cell top 230 through activated selection component 224, digit line BL-CT, and activated switch 235, the change in voltage causes the voltage of the sense node B to change as well. The change in voltage of sense node B will depend on the change in voltage of the digit line BL-CB. For example, where the change in voltage of the digit line BL-CB is from the first voltage to ground, the voltage of sense node B changes from the VREAD voltage to a seventh voltage (SENSEB-1 in FIG. 5C) that is less than the fifth voltage of the sense node A (SENSEA-1 in FIG. 5C). Where the change in voltage of the digit line BL-CB is from the second voltage to ground, the voltage of sense node B changes from the VREAD voltage to an eighth voltage (SENSEB-0 in FIG. 5E) that is greater than the sixth voltage of the sense node A (SENSEA-0 in FIG. 5E).

Prior to time T5 the switch 235 is deactivated by the signal RESTORE to isolate the sense node B from the digit line BL-CT. At time T5 the sense component 125 is activated, and a voltage difference between the sense node A and sense node B is detected and amplified to drive, the sense nodes to complementary voltages (e.g., VREAD and ground). The voltage at the sense node A represents a reference voltage against which the voltage at the sense node B is compared. The reference voltage at sense node A is self-provided, and is based on the voltage of the cell bottom 215 resulting from driving the voltage VREAD to the cell top 230 over the digit line BL-CT at time T1. Where the voltage of sense, node B is less than the voltage of sense node A (e.g., sense node B at the seventh voltage (SENSEB-1 in FIG. 5C) and sense node A at the fifth voltage (SENSEA-1 in FIG. 5C)) the activated sense component 125 drives the sense node B ground and the sense node A to voltage VREAD. In contrast, where the voltage of sense node B is greater than the voltage of sense node A (e.g., sense node B at the eighth voltage (SENSEB-0 in FIG. 5E) and sense node A at the sixth voltage (SENSEA-0 in FIG. 5E)), the activated sense component 125 drives the sense node B to voltage VREAD and the sense node A to ground. The voltages of the sense node A and sense node B are latched by the sense component 125 after being driven to complementary voltages. The latched voltages of the sense nodes A and B represent a corresponding logic value, which may be output, for example, through column decoder 130 as output 135 (FIG. 1).

Also at time T5 or after time T5 the isolation switch 231 is activated to couple the sense node A to the digit line BL-CB and the switch 235 is activated to couple the sense node B to the digit line BL-CT (FIG. 5A). Sense node B is coupled to the digit line BL-CT through the activated switch 235. As a result, the driving of the sense nodes A and B to complementary voltages by the sense component 125 also drives the digit lines BL-CB and BL-CT to the corresponding complementary voltages. Similarly, the driving of the digit lines BL-CB and BL-CT also drives the cell bottom 215 and cell top 230 to the complementary voltages.

For example, driving the sense node B to ground and the sense node A to the voltage VREAD (FIG. 5C) also drives the digit line BL-CT and cell top 230 to ground and drives the digit line BL-CB and cell bottom 215 to the voltage VREAD (FIG. 5B). Driving the sense node B to voltage VREAD and the sense node A to ground (FIG. 5E) also drives the digit line BL-CT and the cell top 230 to voltage VREAD and drives the digit line BL-CB and the cell bottom 215 to ground (FIG. 5D). Driving the complementary voltages to the cell top 230 and the cell bottom 215 ensures that the read operation does not change or degrade the original charge state of the capacitor 205 by restoring the original charge state of the capacitor 205.

The sense component 125 is deactivated at time T6 and the voltages of sense nodes A and B, and digit lines BL-CB and BL-CT are driven to ground. The word lines WL-CB and WL-CT are deactivated at time T7 (FIG. 5A) to deactivate the selection components 220 and 224 to isolate the capacitor 205 from the digit lines BL-CB and BL-CT, all respectively, to complete the read operation.

Embodiments of read operations disclosed, for example, the read operations described with reference to FIGS. 4A-4E and 5A-5E, may increase a sense window for reading ferroelectric memory cells, and avoids spending additional power to bump a capacitor plate to a higher voltage during the read operation. In contrast, power spent on initially driving a capacitor plate (e.g., to the VREAD voltage), may be recycled to increase the sense window.

Figure 6:
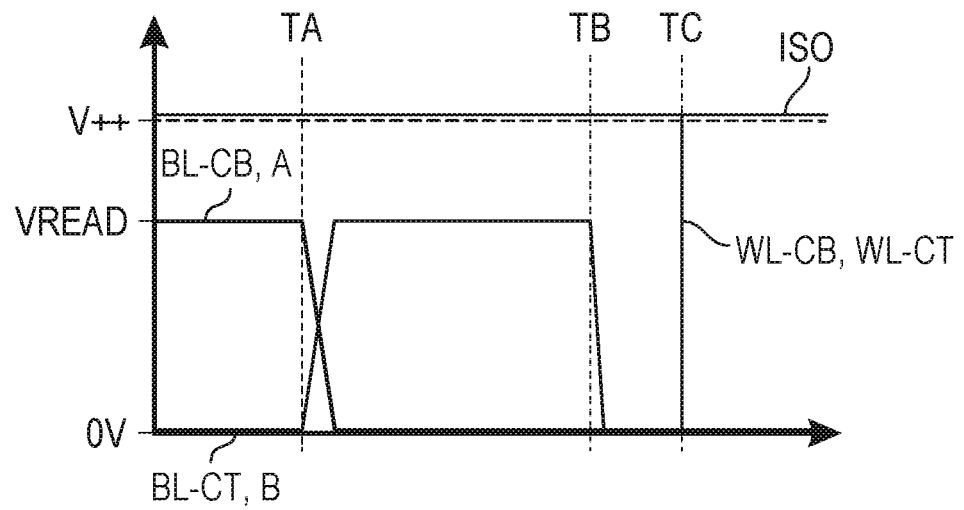
FIG. 6 is a timing diagram of various signals during a write operation according to an embodiment of the disclosure.

FIG. 6 is a timing diagram of various signals during a write operation according to an embodiment of the disclosure. FIG. 6 will be described with reference to memory array 100 and example circuit 200 of FIGS. 1 and 2. In the example write operation of FIG. 6 a logic "0" is written to a memory cell 105 that currently stores a logic "1".

Prior to time TA, the word lines WL-CB and WL-CT are activated to activate selection components 220 and 224, respectively. As a result, the digit line BL-CB is coupled to cell bottom 215 and the digit line BL-CT is coupled to cell top 230 of the capacitor 205. The voltage of the digit line BL-CB is at the VREAD voltage representing the currently stored logic "1" and the voltage of the digit line BL-CT is at a reference voltage, for example, ground. Also prior to time TA, the digit line BL-CB is coupled to sense node A of the sense component 125 through activated isolation switch 231, and the digit line BL-CT is coupled to sense node B of the sense component 125 through activated switch 235. Thus, prior to time TA, the sense nodes A and B are coupled to cell bottom 215 and cell top 230, respectively.

At time TA, a write amplifier (not shown) coupled to sense nodes A and B drives the sense node A front the VREAD voltage to ground and drives sense node B from ground to the VREAD voltage. The voltages of sense nodes A and B are latched by the sense component 125. With the sense nodes A and B driven by the write amplifier, the voltage of the digit line BL-CB changes to ground and the voltage of the digit line BL-CT changes to the VREAD voltage. The ground voltage of the sense node A and the digit line BL-CB represents the logic "0" written to the capacitor 205. The ground voltage of the digit line BL-CB and the VREAD voltage of the digit line BL-CT are applied to the cell bottom 215 and to the cell top 230 through the activated selection components 220 and 224, all respectively. As a result, the capacitor 205 becomes polarized in an opposite polarization to change the stored state data front representing a logic "1" to a logic "0".

By time TB the voltages at the sense nodes A and B have beep latched by the sense component 125 and the voltages of the sense nodes A and B are no longer driven by the write amplifier. The sense component 125 is deactivated at time TB and the voltage of the sense node B (and the digit line BL-CT) changes to ground. With both cell top 230 and the cell bottom 215 at the same voltage, the word lines WL-CB and WL-CT are deactivated at time TC to complete the write operation.

Figure 7:
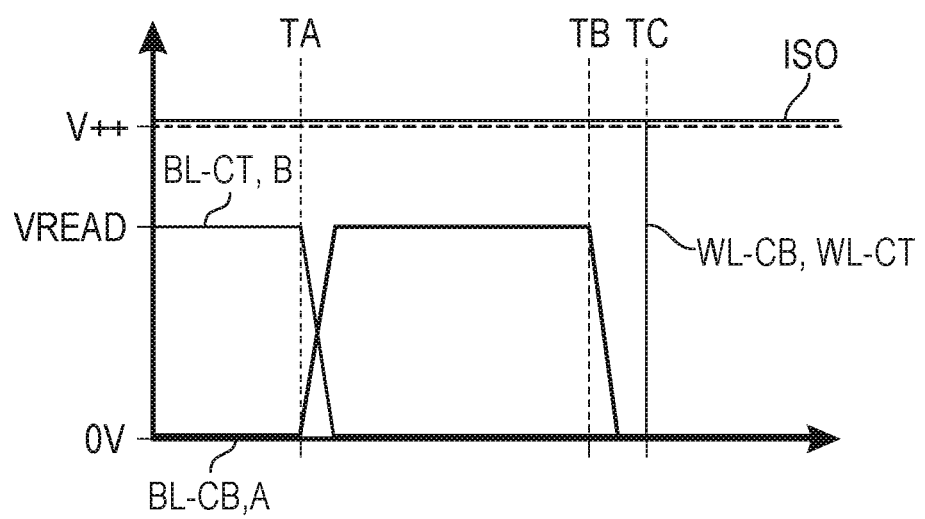
FIG. 7 is a timing diagram of various signals during a write operation according to an embodiment of the disclosure.

FIG. 7 is a timing diagram of various signals during a write operation according to an embodiment of the disclosure. FIG. 7 will be described with reference to memory array 100 and example circuit 200 of FIGS. 1 and 2. In the example write operation of FIG. 7 a logic "1" is written to a memory cell 105 that currently stores a logic "0".

Prior to time TA, the word lines WL-CB and WL-CT are activated to activate selection components 220 and 224, respectively. As a result, the digit line BL-CB is coupled to cell bottom 215 and the digit line is coupled to cell top 230 of the capacitor 205. The voltage of the digit line BL-CB is at ground representing the currently stored logic "0" and the voltage of the digit line BL-CT is at the VREAD voltage. Also prior to time TA, the digit line BL-CB is coupled to sense node A of the sense component 125 through activated isolation switch 231, and the digit line BL-CT is coupled to sense node B of the sense component 125 through activated switch 235. Thus, prior to time TA, the sense nodes A and B are coupled to cell bottom 215 and cell top 230, respectively.

At time TA, a write amplifier (not shown) coupled to sense nodes A and B drives the sense node A from ground to the VREAD voltage and drives sense node B from the VREAD voltage to ground. The voltages of sense nodes A and B are latched by the sense component 125. With the sense nodes A and B driven by the write amplifier, the voltage of the digit line BL-CB changes to the VREAD voltage and the voltage of the digit line BL-CT changes ground. The VREAD voltage of the sense node A and the digit line BL-CB represents the logic "1" written to the capacitor 205. The VREAD voltage of the digit line BL-CB and the ground voltage of the digit line BL-CT are applied to the cell bottom 215 and to the cell top 230 through the activated selection components 220 and 224, all respectively. As a result, the capacitor 205 becomes polarized in an opposite polarization to change the stored state from representing a logic "0" to a logic "1".

By time TB the voltages at the sense nodes A and B have been latched by the sense component 125 and the voltages of the sense nodes A and B are no longer driven by the write amplifier. The sense component 125 is deactivated at time TB and the voltage of the sense node B (and the digit line BL-CT) changes to ground. With both cell top 230 and the cell bottom 215 at the same voltage, the word lines WL-CB and WL-CT are deactivated at time TC to complete the write operation.

In some embodiments, the write operations described with reference to FIGS. 6 and 7 may be performed in conjunction with a read operation, for example, read operations described with reference to FIGS. 4A-4E and 5A-5E. For example, with reference to the example read operation of FIGS. 4A-4E and 5A-5E, the example write operation of FIG. 6 may be performed following the sense component 125 driving the sense nodes A and B, digit lines BL-CB and BL-CT, and cell bottom 215 and cell top 230 to complementary voltages (e.g., following time T5 of FIGS. 4A-4E and 5A-5E) and when the memory cell 105 stores a logic BL-CB and cell bottom 215 at the voltage VREAD and BL-CT and cell top 230 at ground). In another example, with reference to the example read operation of FIGS. 4A-4E and 5A-5E the example write operation of FIG. 7 may be performed following the sense component 125 driving the sense nodes A and B, digit lines BL-CB and BL-CT, and cell bottom 215 and cell top 230 to complementary voltages (e.g., following time T5) and when the memory cell 105 stores a logic 0 (e.g., BL-CB and cell bottom 215 at ground and BL-CT and cell top 230 at the VREAD voltage). The example write operations of FIGS. 6 and 7 may be performed in conjunction with different operations in other embodiments.

As previously described with reference to FIGS. 4 and 5, a logic "1" is represented by a voltage on the cell bottom greater than the reference voltage (e.g., the VREF voltage of the reference signal VBLREF, self-provided reference voltage, etc.) and a logic "0" is represented by a voltage on the cell bottom less than the reference voltage. As also previously described with reference to the example write operations of FIGS. 6 and 7 a logic "1" is written by applying the VREAD voltage to the cell, bottom and ground the cell top, and a logic "0" is written by applying ground to the cell bottom and the VREAD voltage to the cell top. In some examples, the logic values corresponding to the voltages relative to the reference voltage, and the application of the net positive/negative voltages for writing the logic values may be reversed without departing from the scope of the disclosure.

The example voltages and signal timing described with reference to the read and write operations of FIGS. 4-7 have been provided for illustrative purposes, and are not intended to limit the scope of the present disclosure. It will be appreciated that the voltages and relative signal timing may be modified without departing from the scope of the present disclosure.

Figure 8:
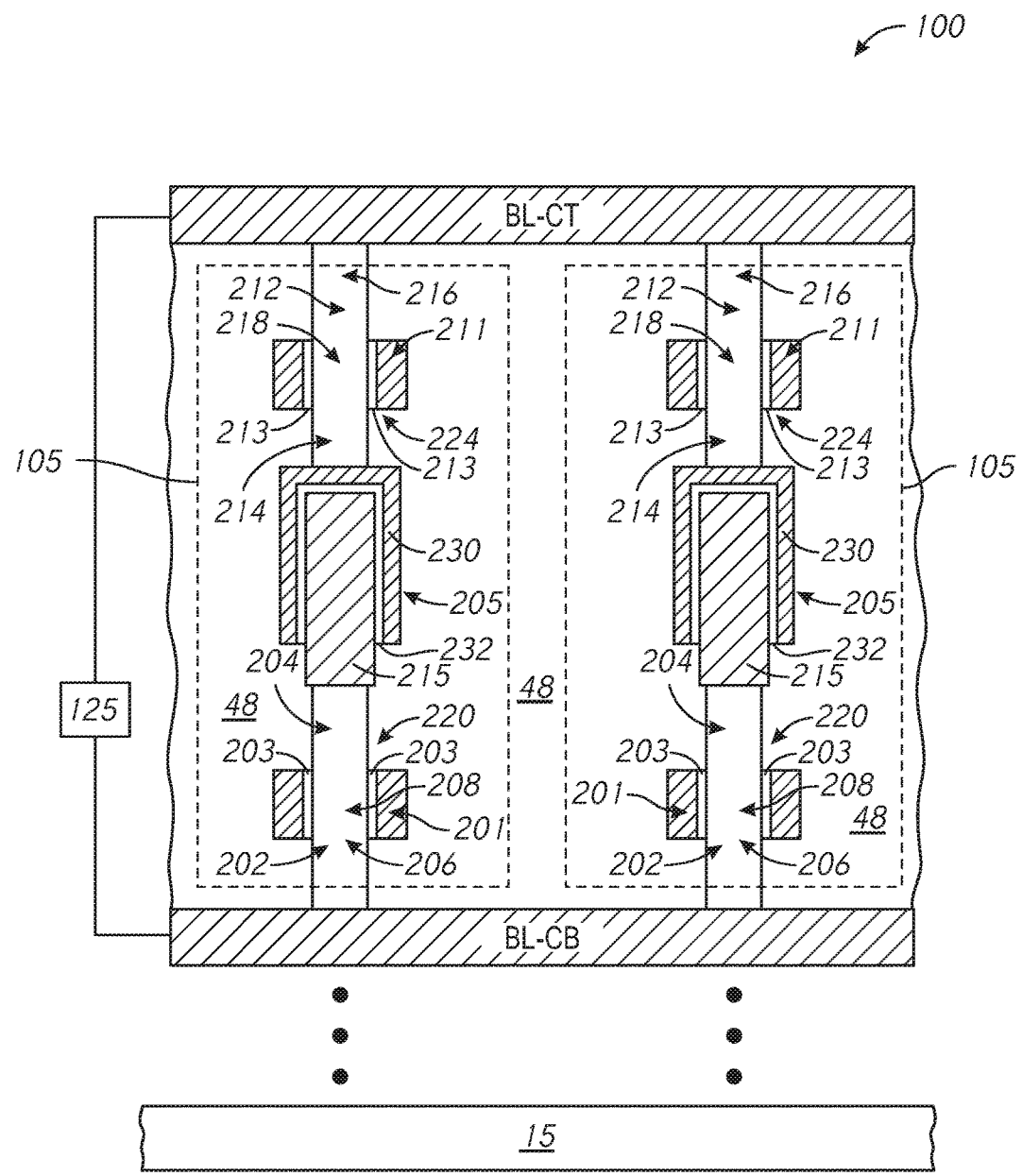
FIG. 8 is a diagram depicting a cross-sectional side view of a portion of a memory array showing memory cells according to an embodiment of the disclosure.

FIG. 8 illustrates a portion of a memory array 100 including an example embodiment of memory cells 105 according to the disclosure.

The illustrated region of memory array 100 includes digit lines BL-CT and BL-CB. The digit lines BL-CT and BL-CB are vertically offset relative to another and may be connected to a sense component 125. A pair of adjacent memory cells 105 are shown, with such adjacent memory cells being in a common column as one another within the memory array (e.g., being along a common column represented by digit lines BL-CT and BL-CB). Insulative material 48 is shown to surround the various components of memory cells 105. In some embodiments the memory cells 105 may be referred to as substantially identical memory cells along a column of a memory array, with the term "substantially identical" meaning that the memory cells are identical to one another within reasonable tolerances of fabrication and measurement.

The digit line BL-CB is shown to be over and supported by a base 15. Such base may be a semiconductor material. The memory cells 105 each includes selection components 220 and 224 and a ferroelectric capacitor 205. The capacitor 205 is vertically between the selection components 220 and 224 of memory cell 105. The capacitor 205 includes a first plate, cell top 230, and a second plate, cell bottom 215, and a ferroelectric material 232 disposed between the cell top 230 and the cell bottom 215. Although the cell top 230 is shown to be container-shaped and the cell bottom 215 is shown to extend within such container shape, in other embodiments the cell top and bottom may have other configurations. For instance, the cell top and bottom may have planar configurations. Pillar 212 extends from digit line BL-CT to the cell top 230 of capacitor 205, and the pillar 202 extends from the digit line BL-CB to the cell bottom 215 of capacitor 205.

The selection component 224 has source/drain region 214 extending to the cell top 230 of capacitor 205, and has source/drain region 216 extending to the digit line BL-CT. The selection component 224 also has channel region 218 between the source/drain regions 214 and 216. Gate 211 is along the channel region 218 and offset from the channel regions by gate dielectric material 213. The gate 211 may be included in a word line WL-CT.

The selection component 220 has source/drain region 204 extending to the cell bottom 215 of capacitor 205, and has source/drain region 206 extending to the digit line BL-CB. The selection component 220 also has channel region 208 between the source/drain regions 204 and 206. Gate 201 is along the channel region 208 and offset from the channel regions by gate dielectric material 203. The gate 201 may be included in a word line WL-CB.

As shown in the embodiment of FIG. 8, the selection components 220 and 224 and capacitor 205 of the memory cell 105 are vertically stacked, which may enable memory cells 105 to be packed to high levels of integration.

In some embodiments, the relative orientations of digit lines BL-CT and BL-CB are reversed so that the digit line BL-CT is over a supporting substrate 15 and the digit line BL-CB is over the digit line BL-CT. In such other embodiments the illustrated capacitors 205 would be inverted relative to the shown configuration of FIG. 8 and accordingly container shaped cell tops 230 would open upwardly instead of downwardly.

Figure 9:
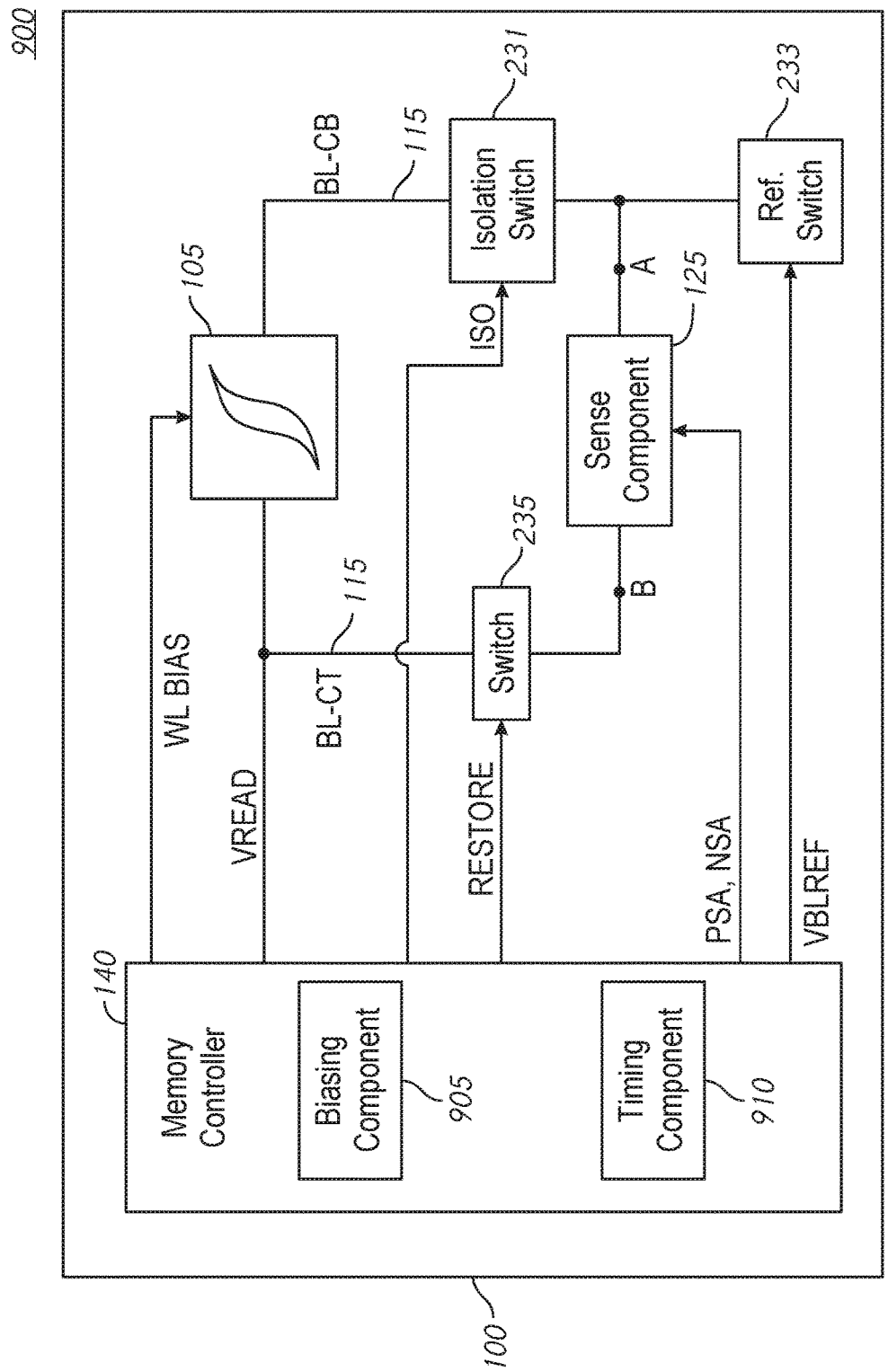
FIG. 9 is a block diagram of a memory array that supports a ferroelectric memory in accordance with various embodiments of the present disclosure.

FIG. 9 illustrates a block diagram of a portion of memory 900 that includes memory array 100 that supports a ferroelectric memory in accordance with various embodiments of the present disclosure. Memory array 100 may be referred to as an electronic memory apparatus and includes memory controller 140 and memory cell 105, which may be examples of memory controller 140 and memory cell 105 described with reference to FIG. 1, 2, or 4-7.

Memory controller 140 may include biasing component 905 and timing component 910, and may operate memory array 100 as described in FIG. 1. Memory controller 140 may be in electronic communication with word lines 110, digit lines 115 and sense component 125, which may be examples of word line 110, digit line 115, and sense component 125 described with reference to FIG. 1, 2, or 4-7. Memory controller 140 may also be in electronic communication with reference switch 233, isolation switch 231, and switch 235, which may be examples of the reference switch 233, isolation switch 231, and switch 235, respectively, described with reference to FIG. 2 or 4-7. In some embodiments, for example, embodiments using a constant reference voltage, the memory controller 140 may provide a reference signal VBLREF to the sense component 125 through the reference switch 233. The component of memory array 100 may be in electronic communication with each other and may perform the functions described with reference to FIGS. 1-7.

Memory controller 140 may be configured to activate word lines 110 or digit lines 115 by applying voltages to the word and digit lines. For example, biasing component 905 may be configured to apply a voltage to operate memory cell 105 to read or write memory cell 105 as described above. In some cases, memory controller 140 may include a row decoder, column decoder, or both, as described with reference to FIG. 1. This may enable memory controller 140 to access one or more memory cells 105. Biasing component 905 may also provide a reference signal VBLREF to sense component 125 in some embodiments. Additionally, biasing component 905 may provide voltage potentials for the operation of sense component 125. The biasing component 905 may include, for example, the driver circuit 237 configured to provide the read voltage VREAD when activated, and/or the driver circuit 239 configured to drive the digit line BL-CB to ground when activated.

Memory controller 140 may activate isolation switch 231 based on receiving the access operation request for the ferroelectric memory cell 105—that is, memory controller 140 may electrically connect memory cell 105 to sense component 125. Memory controller 140 may further determine a logic state of the ferroelectric memory cell 105 based on activating sense component 125, and write the logic state of the ferroelectric memory cell 105 back to the ferroelectric memory cell 105.

In some cases, memory controller 140 may perform its operations using timing component 910. For example, timing component 910 may control the timing of the various word line selections or cell top biasing, including timing fix switching and voltage application to perform the memory functions, such as reading and writing, discussed herein. In some cases, timing component 910 may control the operations of biasing component 905. For example, the memory controller 140 may control the biasing component 905 to provide a read voltage VREAD to the digit line BL-CT to change the voltage of the memory cell, the digit line BL-CB, and sense node A of sense component 125. The memory controller 140 may then control the biasing component 905 to drive the digit line BL-CB to ground to change the voltage of the memory cell, the digit line BL-CT, and sense node B. Following the digit line BL-CB being driven to ground, the memory controller 140 may control the sensing component 125 to compare the voltage of sense node B to the voltage of sense node A, which is at a self-provided reference voltage.

Sense component 125 may compare a signal from memory cell 105 (through digit line 115) with a reference voltage. As previously discussed, in some embodiments the reference voltage may be the voltage of a reference signal VBLREF. The reference signal VBLREF may have a voltage with a value between the two sense voltages, as described with reference to FIGS. 2, 4, and 5. In other embodiments, the reference voltage may be self-provided, for example, using as a reference voltage the voltage of a sense node resulting from biasing a memory cell 105. Upon determining and amplifying the voltage difference, the sense component 125 may latch the state, where it may be used in accordance with the operations of an electronic device that memory array 100 is a part.

Figure 10:
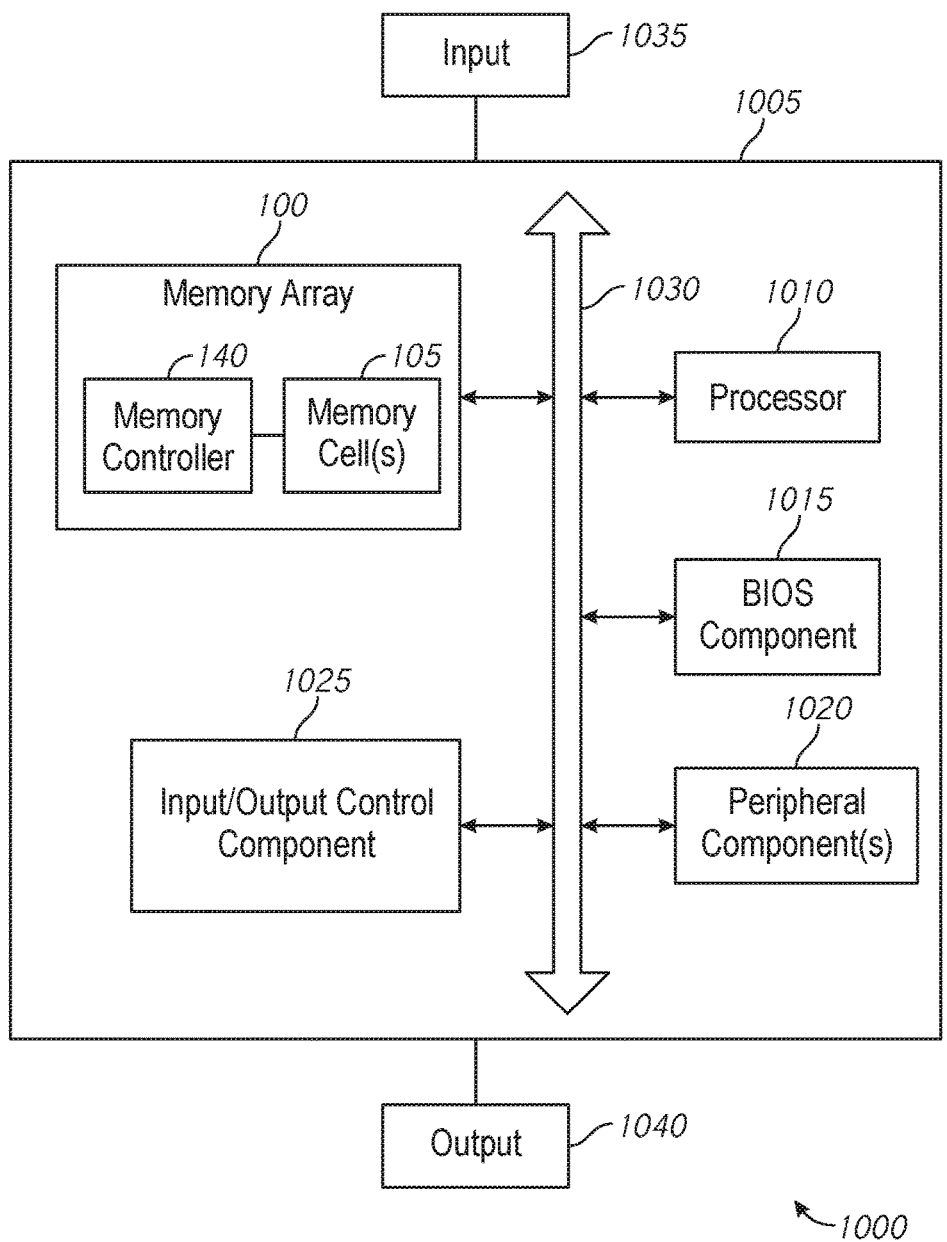
FIG. 10 is a block diagram of a system that supports a ferroelectric memory in accordance with various embodiments of the present disclosure.

FIG. 10 illustrates a system 1000 that supports a ferroelectric memory in accordance with various embodiments of the present disclosure. System 1000 includes a device 1005, which may be or include a printed circuit board to connect or physically support various components. Device 1005 may be a computer, notebook computer, laptop, tablet computer, mobile phone, or the like. Device 1005 includes a memory array 100, which may be an example of memory array 100 as described with reference to FIGS. 1 and 9. Memory array 100 may contain memory controller 140 and memory cell(s) 105, which may be examples of memory controller 140 described with reference to FIGS. 1 and 9 and memory cells 105 described with reference to FIGS. 1, 2, and 4-9. Device 1005 may also include a processor 1010, BIOS component 1015, peripheral component(s) 1020, and input/output control component 1025. The components of device 1005 may be in electronic communication with one another through bus 1030.

Processor 1010 may be configured to operate memory array 100 through memory controller 140. In some cases, processor 1010 may perform the functions of memory controller 140 described with reference to FIGS. 1 and 9. In other cases, memory controller 140 may be integrated into processor 1010. Processor 1010 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 1010 may perform various functions and operate the memory array 100 as described herein. Processor 1010 may, for example, be configured to execute computer-readable instructions stored in memory array 100 to cause device 1005 perform various functions or tasks.

BIOS component 1015 may be a software component that includes a basic input/output system (BIOS) operated as firmware, which may initialize and run various hardware components of system 1000. BIOS component 1015 may also manage data flow between processor 1010 and the various components, e.g., peripheral components 1020, input/output control component 1025, etc. BIOS component 1015 may include a program or software stored in read-only memory (ROM), flash memory, or any other non-volatile memory.

Peripheral component(s) 1020 may be any input or output, device, or an interface for such devices, that is integrated into device 1005. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1025 may manage data communication between processor 1010 and peripheral component(s) 1020, input devices 1035, or output devices 1040. Input/output control component 1025 may also manage peripherals not integrated into device 1005. In some cases, input/output control component 1025 may represent a physical connection or port to the external peripheral.

Input 1035 may represent a device or signal external to device 1005 that provides input to device 1005 or its components. This may include a user interface or interface with or between other devices. In some cases, input 1035 may, be a peripheral that interfaces with device 1005 via peripheral component(s) 1020 or may be managed by input/output control component 1025.

Output 1040 may represent a device or signal external to device 1005 configured to receive output from device 1005 or any of its components. Examples of output 1040 may include a display, audio speakers, a printing device, another processor or printed circuit board, etc. In some cases, output 1040 may be a peripheral that interfaces with device 1005 via peripheral component(s) 1020 or may be managed by input/output control component 1025.

The components of memory controller 140, device 1005, and memory array 100 may be made up of circuitry designed to carry out their functions. This may include various circuit elements, for example, conductive lines, transistors, capacitors, inductors, resistors, amplifiers, or other active or inactive elements, configured to carry out the functions described herein.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. A method, comprising:
   increasing a voltage of a first cell plate of a capacitor to change a voltage of a second cell plate of the capacitor, a second digit line, and a second sense node;
   decreasing the voltage of the second cell plate and the second digit line to change the voltage of the first cell plate, a first digit line, and a first sense node;
   driving the first sense node to a first voltage and driving the second sense node to a second voltage responsive to the voltage of the first sense node being greater than the voltage of the second sense node; and
   driving the first sense node to the second voltage and driving the second sense node to the first voltage responsive to the voltage of the first sense node being less than the voltage of the second sense node,
   wherein the second cell plate of the capacitor changes from an initial voltage to a first increased voltage responsive to increasing the voltage of the first cell plate for a first polarization of the capacitor and wherein the second cell plate of the capacitor changes from the initial voltage to a second increased voltage responsive to increasing the voltage of the first cell plate for a second polarization of the capacitor, the first and second voltages are different.

2. The method of claim 1 wherein the voltage of the first sense node is greater than the voltage of the second sense node when the capacitor has a first polarization, and wherein the voltage of the first sense node is less than the voltage of second sense node when the capacitor has a second polarization different than the first polarization.

3. The method of claim 1, further comprising providing a constant voltage to the second sense node as a reference voltage.

4. The method of claim 3 wherein decreasing the voltage of the second cell plate and the second digit line comprises decreasing the voltage of the second cell plate from the constant voltage to ground.

5. The method of claim 1 wherein decreasing the voltage of the second cell plate and the second digit line comprises decreasing the voltage of the second cell plate from the first or second increased to the initial voltage.

6. A method, comprising:
   providing a read voltage to a first digit line and to a first plate of a capacitor coupled to the first digit line to cause a voltage of a second plate of the capacitor, of a second digit line coupled to the second plate of the capacitor, and of a second sense node of a sense component to change from an initial voltage to an increased voltage, the second sense node coupled to the second digit line;
   coupling a first sense node of the sense component to the first digit line;
   decoupling the second sense node from the second digit line;
   driving the voltage of the second digit line and the second plate of the capacitor from the increased voltage to the initial voltage to cause a voltage of the first plate of the capacitor, the first digit line, and the first sense node to change;
   comparing at the sense component the voltage of the first sense node to a reference voltage; and
   based on the comparison, driving the first sense node, first digit line, and first plate of the capacitor to a first voltage and driving the second sense node, second digit line, and second plate of the capacitor to a second voltage, the second voltage complementary to the first voltage.

7. The method of claim 6, further comprising activating selection components to couple the first plate of the capacitor to the first digit line and to couple the second plate of the capacitor to the second digit line.

8. The method of claim 6, further comprising:
   changing the voltage of the first and second plates of the capacitor to a same voltage, and
   deactivating selection components to isolate the first plate and the second plate of the capacitor from the first and second digit lines, respectively.

9. The method of claim 6 wherein the initial voltage is ground.

10. The method of claim 6 wherein driving the first sense node, first digit line, and first plate of the capacitor to a first voltage and driving the second sense node, second digit line, and second plate of the capacitor to a second voltage, the second voltage complementary to the first voltage, comprises:
    driving the first sense node, first digit line, and first plate of the capacitor to ground and driving the second sense node, second digit line, and second plate of the capacitor to the read voltage responsive to the voltage of the first sense node being less than the reference voltage; and
    driving the first sense node, first digit line, and first plate of the capacitor to the read voltage and driving the second sense node, second digit line, and second plate of the capacitor to ground responsive to the voltage of the first sense node being greater than the reference voltage.

11. The method of claim 6 wherein the reference voltage is a constant voltage.

12. The method of claim 6 wherein the reference voltage is a first reference voltage responsive to a first increased voltage and wherein the reference voltage is a second reference voltage that is different than the first reference voltage responsive to a second increased voltage.

13. A method, comprising:
    coupling a voltage increase across a capacitor from a first plate to a second plate, a resulting voltage at the second plate provided to a sense component, the resulting voltage at the second plate having a first voltage responsive to the capacitor having a first polarization and having a second voltage responsive to the capacitor having a second polarization;
    coupling a voltage decrease across the capacitor from the second plate to the first plate, a resulting voltage at the first plate provided to the sense component; and
    latching at the sense component a voltage difference between the resulting voltage at the first plate and a reference voltage.

14. The method of claim 13 wherein the reference voltage is the resulting voltage at the second plate.

15. The method of claim 13 wherein the reference voltage is a constant voltage.

16. The method of claim 13, further comprising:
    outputting a first logic value when the resulting voltage at the first plate is greater than the reference voltage; and outputting a second logic value when the resulting voltage at the first plate is less than the reference voltage.

17. The method of claim 13 wherein coupling a voltage decrease across the capacitor from the second plate to the first plate comprises driving the second plate from the resulting voltage at the second plate to ground.

18. The method of claim 13 wherein coupling a voltage increase across a capacitor from a first plate to a second plate comprises driving the first plate from ground to a read voltage.

19. The method of claim 13 wherein latching at the sense component a voltage difference between the resulting voltage at the first plate and the reference voltage comprises:
   detecting the voltage difference between the resulting voltage at the first plate and the reference voltage; and
   amplifying the voltage difference between the resulting voltage at the first plate and the reference voltage.

20. The method of claim 13 further comprising restoring the polarization of the capacitor with the latched voltages.

21. A method, comprising:
   providing a read voltage to a first plate of a ferroelectric memory cell to change a voltage on a second plate of the ferroelectric memory cell;
   driving the second plate of the ferroelectric memory cell to ground to change a voltage on the first plate of the ferroelectric memory cell;
   after driving the second plate of the ferroelectric memory cell to ground, comparing the voltage on the first plate of the ferroelectric memory cell to a reference voltage at a sense node;
   providing a first voltage to the sense node responsive to the voltage on the first plate of the ferroelectric memory cell being less than the reference voltage; and
   providing a second voltage to the sense node responsive to the voltage on the first plate of the ferroelectric memory cell being greater than the reference voltage.

22. The method of claim 21, further comprising:
   providing the second voltage to a complementary sense node responsive to the voltage on the first plate of the ferroelectric memory cell being less than the reference voltage; and
   providing the first voltage to the complementary sense node responsive to the voltage on the first plate of the ferroelectric memory cell being greater than the reference voltage.

23. The method of claim 21, further comprising:
   providing the first voltage to the second plate of the ferroelectric memory cell responsive to the voltage on the first plate of the ferroelectric memory cell being less than the reference voltage; and
   providing the second voltage to the second plate of the ferroelectric memory cell responsive to the voltage on the first plate of the ferroelectric memory cell being greater than the reference voltage.

24. The method of claim 21, further comprising providing a reference signal to the sense node, the reference signal having the reference voltage.

25. The method of claim 21 wherein the reference voltage at the sense node is based on the voltage on the second plate of the ferroelectric memory cell resulting from providing the read voltage to the first plate of the ferroelectric memory cell.

26. The method of claim 21 wherein the reference voltage at the sense node is a first reference voltage responsive to a first polarization of the ferroelectric memory cell and the reference voltage at the sense node is a second reference voltage responsive to a second polarization of the ferroelectric memory cell.

* * * * *